United States Patent
Miyazaki et al.

(10) Patent No.: US 11,579,227 B2
(45) Date of Patent: Feb. 14, 2023

(54) MAGNETIC RESONANCE IMAGING APPARATUS AND MAGNETIC RESONANCE IMAGING METHOD

(71) Applicant: CANON MEDICAL SYSTEMS CORPORATION, Otawara (JP)

(72) Inventors: Mitsue Miyazaki, Vernon Hills, IL (US); Yoshimori Kassai, Nasushiobara (JP)

(73) Assignee: CANON MEDICAL SYSTEMS CORPORATION, Otawara (JP)

( * ) Notice: Subject to any disclaimer, the term of this patent is extended or adjusted under 35 U.S.C. 154(b) by 0 days.

(21) Appl. No.: 17/305,677

(22) Filed: Jul. 13, 2021

(65) Prior Publication Data

US 2023/0012501 A1    Jan. 19, 2023

(51) Int. Cl.
*G01R 33/563*    (2006.01)
*G01R 33/54*    (2006.01)
(Continued)

(52) U.S. Cl.
CPC ....... *G01R 33/543* (2013.01); *G01R 33/5635* (2013.01); *G01R 33/482* (2013.01);
(Continued)

(58) Field of Classification Search
CPC .............. G01R 33/543; G01R 33/5635; G01R 33/4818; G01R 33/482; G01R 33/4824;
(Continued)

(56) References Cited

U.S. PATENT DOCUMENTS

| 10,488,484 | B2 | 11/2019 | Miyazaki et al. |
| 2009/0076374 | A1* | 3/2009 | Kimura ................ A61B 5/417 |
| | | | 600/410 |
| 2017/0219672 | A1* | 8/2017 | Miyazaki ........... G01R 33/5635 |

FOREIGN PATENT DOCUMENTS

JP    6866170 B2    4/2021

OTHER PUBLICATIONS

Takahashi, Junji, et al. "Comparison of axial and coronal acquisitions by non-contrast-enhanced renal 3D MR angiography using flow-in time-spatial labeling inversion pulse." Magnetic Resonance Materials in Physics, Biology and Medicine 33.1 (2020): 95-102. (Year: 2020).*

(Continued)

*Primary Examiner* — Rishi R Patel
(74) *Attorney, Agent, or Firm* — Oblon, McClelland, Maier & Neustadt, L.L.P.

(57) ABSTRACT

A magnetic resonance imaging apparatus according to an embodiment includes sequence controlling circuitry and processing circuitry. The sequence controlling circuitry is configured to execute (i) a first pulse sequence in which a spatially selective Inversion recovery (IR) pulse and a spatially non-selective IR pulse are applied, and subsequently an acquisition is performed and (ii) a second pulse sequence in which the spatially non-selective IR pulse is applied without applying the spatially selective IR pulse, and subsequently an acquisition is performed, while varying the first TI period, with respect to a plurality of first TI periods. The processing circuitry is configured to calculate a second TI period to be used in a third pulse sequence and a fourth pulse sequence, based on data obtained from the first pulse sequence and the second pulse sequence. The sequence controlling circuitry executes (iii) the third pulse sequence in which the spatially selective IR pulse and the spatially non-selective IR pulse are applied, and subse- (Continued)

quently an acquisition is performed and (iv) the fourth pulse sequence in which the spatially non-selective IR pulse is applied without applying the spatially selective IR pulse, and subsequently an acquisition is performed. The processing circuitry generates a magnetic resonance image of an imaged region based on data obtained from the third pulse sequence and the fourth pulse sequence.

5 Claims, 9 Drawing Sheets

(51) Int. Cl.
*G01R 33/48* (2006.01)
*G01R 33/483* (2006.01)
(52) U.S. Cl.
CPC ...... *G01R 33/4818* (2013.01); *G01R 33/4824* (2013.01); *G01R 33/4838* (2013.01)
(58) Field of Classification Search
CPC ............ G01R 33/4838; G01R 33/4822; G01R 33/4826
See application file for complete search history.

(56) References Cited

OTHER PUBLICATIONS

Parienty, Isabelle, et al. "Renal artery stenosis evaluation in chronic kidney disease patients: nonenhanced time-spatial labeling inversion-pulse three-dimensional MR angiography with regulated breathing versus DSA." Radiology 259.2 (2011): 592-601. (Year: 2011).*
Kim, S.-G., "Quantification of Relative Cerebral Blood Flow Change by Flow-Sensitive Alternating Inversion Recovery (FAIR) Technique: Application to Functional Mapping". Magn Reson Med., 1995, vol. 34, pp. 293-301.
Edelman, R.R., et al., "Qualitative Mapping of Cerebral Stood Row and Functional Localization with Echo-planar MR Imaging and Signal Targeting with Alternating Radio Frequency", Radiology. 1994, vol. 192, pp. 513-520.
Dai. W., PhD., et al., "Continuous Flow Driven inversion for Arterial Spin Labeling Using Pulsed Radiofrequency and Gradient Fields" Magn Reson Med.. 2008. vol. 60 No. 6, pp. 1488-1497.
"Arterial Spin Labeling" Retrieved from the Internet: URL: https://cfmriweb.ucsd.edu/Howto/3T/ss, I.html#q07, Retrieved on [Jul. 20, 2021], 12 pages.
Extended European Search Report dated Nov. 28, 2022, in European Patent Application No. 22 184 781.7, 12 pages.

* cited by examiner

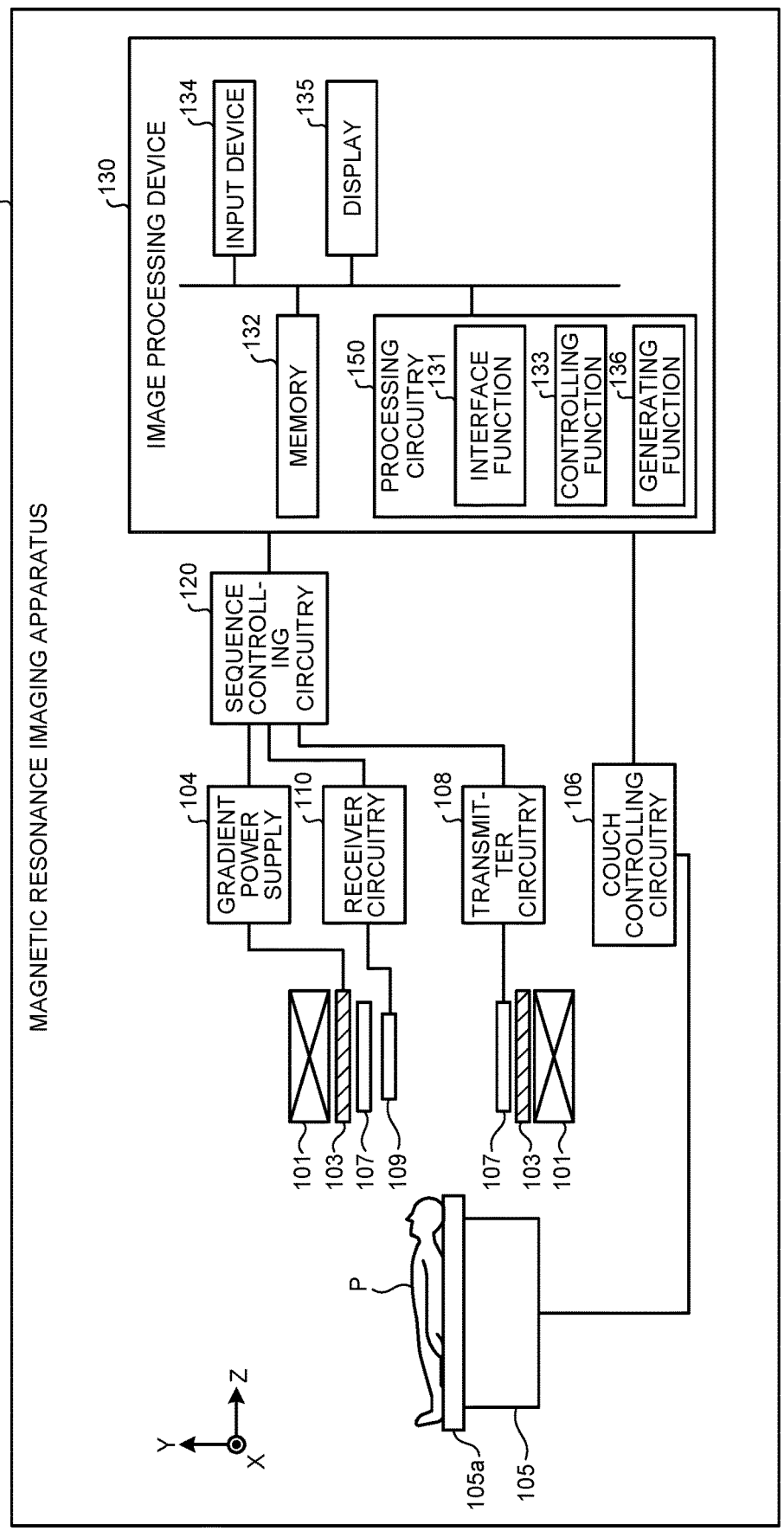

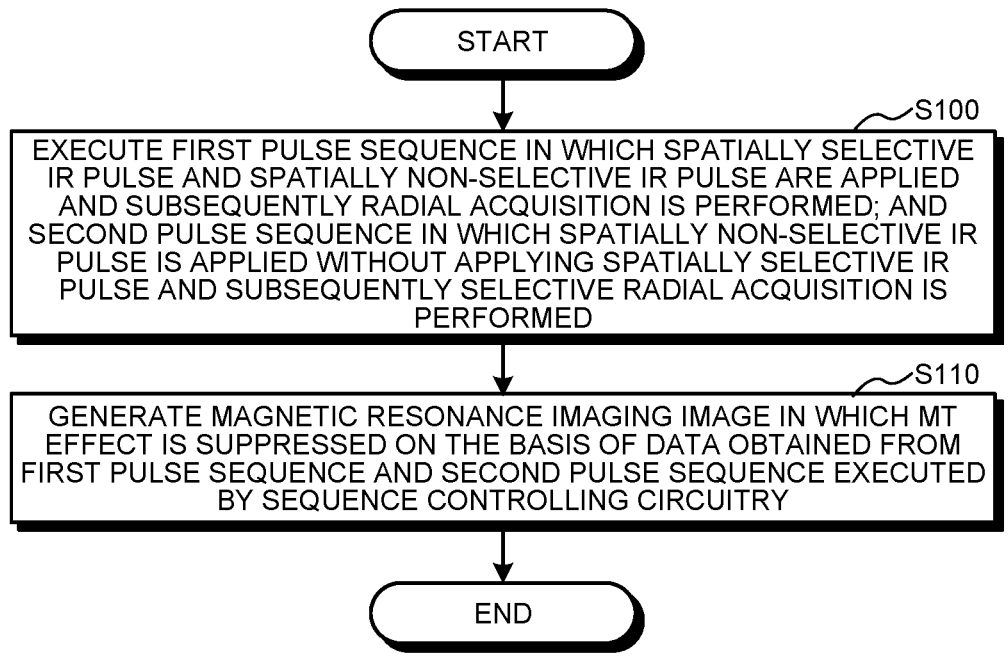

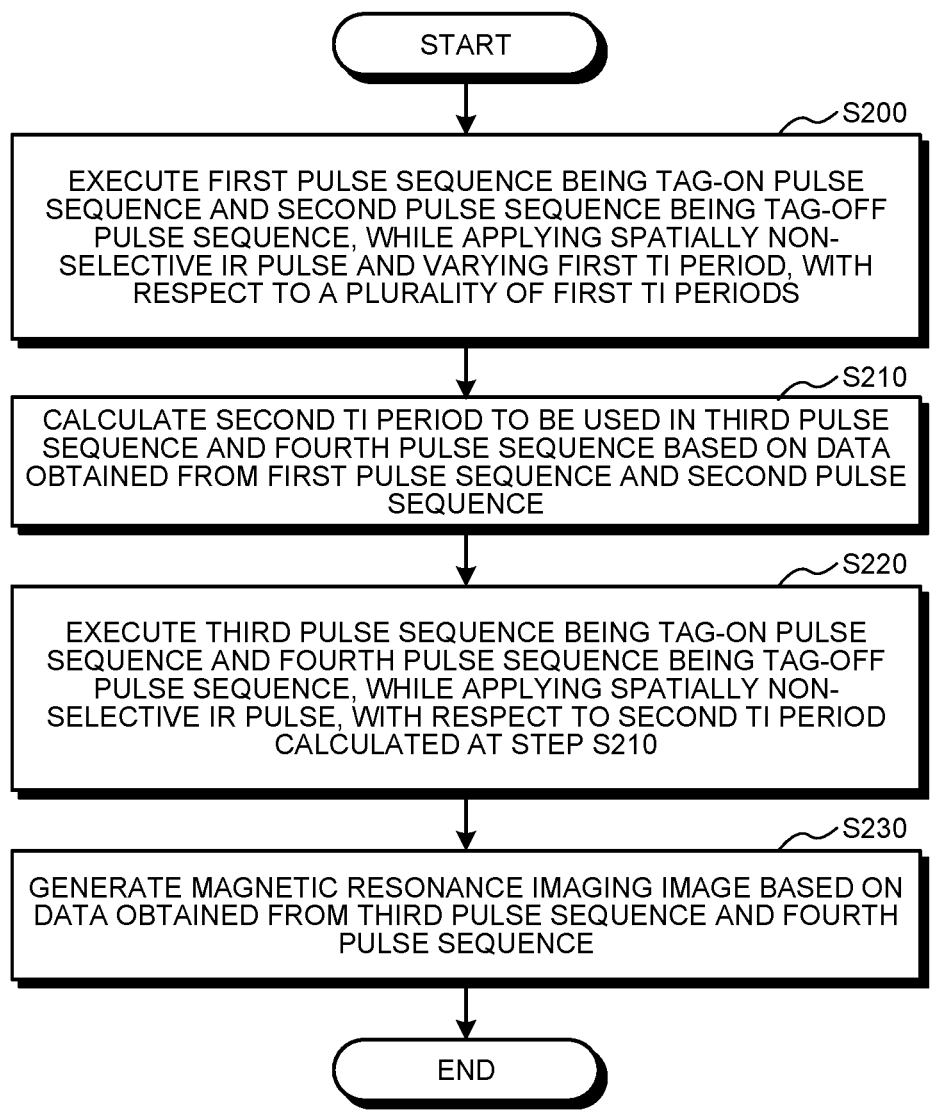

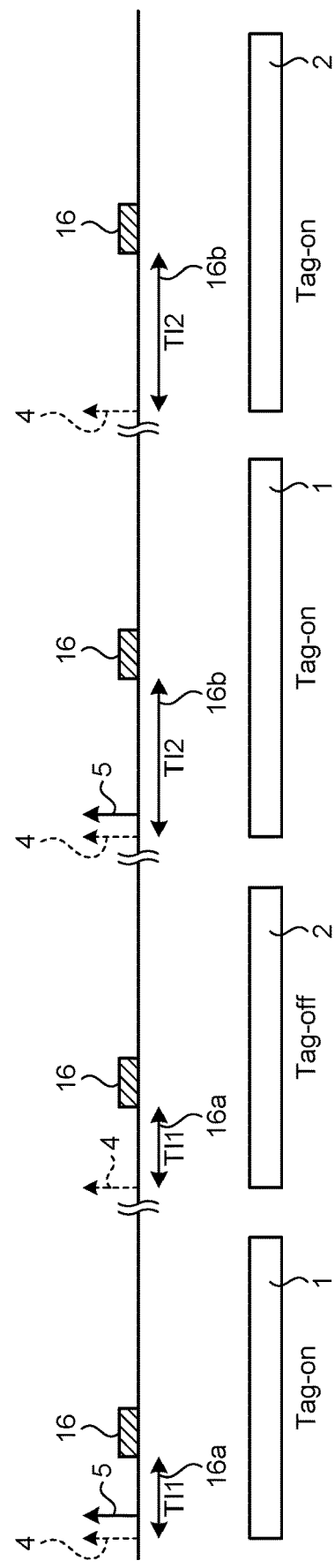

MAGNETIC RESONANCE IMAGING APPARATUS AND MAGNETIC RESONANCE IMAGING METHOD

CROSS-REFERENCE TO RELATED APPLICATIONS

Field

Embodiments described herein relate generally to a magnetic resonance imaging apparatus and a magnetic resonance imaging method.

Background

Perfusion techniques are used for rendering hemodynamics of capillaries in a tissue by using an Arterial Spin Labeling (ASL) method by which a Radio Frequency (RF) pulse is radiated onto blood vessels so as to invert blood spins and to use the inverted spins as an endogenous tracer. Known examples of the perfusion techniques include a Flow-sensitive Alternating Inversion Recovery (FAIR) method, a Continuous Arterial Spin Labeling (CASL) method, and a pulsed-Continuous Arterial Spin Labeling (pCASL) method.

The FAIR method is basically a two-dimensional imaging method by which an imaging process is performed by applying a spatially selective pulse to a Region Of Interest (ROI) slice. Although the FAIR method has an advantage of achieving a high Signal-to-Noise Ratio (SNR), a problem remains where, when a spatially selective IR pulse has repeatedly been applied, the perfusion curve fails to return to the original baseline thereof.

Further, by continuously applying a spatially selective pulse, the pCASL method is able to achieve a high SNR similarly to the FAIR method. However, the pCASL method has the problem where, when a spatially selective IR pulse has repeatedly been applied, the perfusion curve fails to return to the original baseline thereof. In addition, another problem arises where it is necessary to suppress the Magnetization Transfer (MT) effect, especially in brain.

For the reasons stated above, with the perfusion techniques using an ASL method, how to suppress the MT effect is important.

BRIEF DESCRIPTION OF THE DRAWINGS

FIG. 1 is a diagram illustrating a magnetic resonance imaging apparatus according to an embodiment;

FIG. 2 is a flowchart illustrating a processing procedure performed by the magnetic resonance imaging apparatus according to a first embodiment;

FIG. 7 is a flowchart illustrating a processing procedure performed by a magnetic resonance imaging apparatus according to a second embodiment;

FIG. 8 is a chart for explaining pulse sequences executed by the magnetic resonance imaging apparatus according to the second embodiment.

DETAILED DESCRIPTION

Figure 3A:
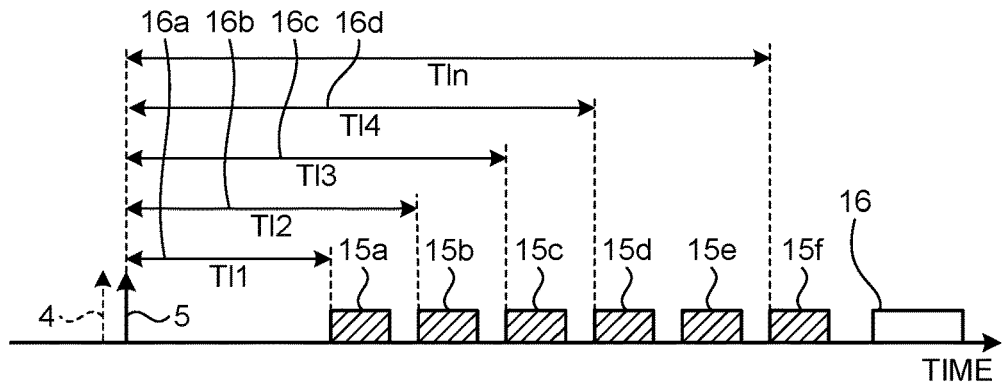
FIGS. 3A and 3B are charts for explaining pulse sequences executed by the magnetic resonance imaging apparatus according to the first embodiment.

A magnetic resonance imaging apparatus according to an embodiment includes sequence controlling circuitry and processing circuitry. The sequence controlling circuitry is configured to execute (i) a first pulse sequence in which a spatially selective inversion recovery (IR) pulse and a spatially non-selective IR pulse are applied, and subsequently a Cartesian acquisition is performed when a first Inversion Time (TI) period has elapsed, and a radial acquisition is performed after the Cartesian acquisition and (ii) a second pulse sequence in which the spatially non-selective IR pulse is applied without applying the spatially selective IR pulse, and subsequently a Cartesian acquisition is performed when the first TI period has elapsed, and a radial acquisition is performed after the Cartesian acquisition, while varying the first TI period, with respect to a plurality of first TI periods. The processing circuitry is configured to calculate a second TI period to be used in a third pulse sequence and a fourth pulse sequence, based on data obtained from the first pulse sequence and the second pulse sequence executed by the sequence controlling circuitry. The sequence controlling circuitry executes (iii) the third pulse sequence in which the spatially selective IR pulse and the spatially non-selective IR pulse are applied, and subsequently a Cartesian acquisition is performed when the second TI period has elapsed, and a radial acquisition is performed after the Cartesian acquisition and (iv) the fourth pulse sequence in which the spatially non-selective IR pulse is applied without applying the spatially selective IR pulse, and subsequently a Cartesian acquisition is performed when the second TI period has elapsed, and a radial acquisition is performed after the Cartesian acquisition. The processing circuitry generates a magnetic resonance image of an imaged region based on data obtained from the third pulse sequence and the fourth pulse sequence.

Exemplary embodiments of the present disclosure will be explained below with reference to the accompanying drawings. In the following sections, some of the constituent elements having mutually the same configurations will be referred to by using the same reference characters, and duplicate explanations thereof will be omitted.

First Embodiment

FIG. 1 is a block diagram illustrating a magnetic resonance imaging apparatus 100 according to a first embodiment. As illustrated in FIG. 1, the magnetic resonance imaging apparatus 100 includes a static magnetic field magnet 101, a static magnetic field power supply (not illustrated), a gradient coil 103, a gradient power supply 104, a couch 105, couch controlling circuitry 106, a transmission coil 107, transmitter circuitry 108, a reception coil 109, receiver circuitry 110, sequence controlling circuitry 120 (a sequence controlling unit), and an image processing device 130. The magnetic resonance imaging apparatus 100 does not include an examined subject (hereinafter, "patient") P (e.g., a human body). Further, the configuration illustrated in FIG. 1 is merely an example. For instance, any of the functional units in the sequence controlling circuitry 120 and the image processing device 130 may be integrated together or separated as appropriate.

The static magnetic field magnet 101 is a magnet formed to have a hollow and substantially circular cylindrical shape and is configured to generate a static magnetic field in the space on the inside thereof. For example, the static magnetic field magnet 101 is a superconductive magnet or the like and is magnetically excited by receiving a supply of an electric current from the static magnetic field power supply. The static magnetic field power supply is configured to supply the electric current to the static magnetic field magnet 101. In another example, the static magnetic field magnet 101 may be a permanent magnet. In that situation, the magnetic resonance imaging apparatus 100 does not have to include a static magnetic field power supply. Further, the static magnetic field power supply may be provided separately from the magnetic resonance imaging apparatus 100.

The gradient coil 103 is a coil formed to have a hollow and substantially cylindrical shape and is arranged on the inside of the static magnetic field magnet 101. The gradient coil 103 is formed by combining together three coils corresponding to X-, Y-, and Z-axes that are orthogonal to one another. By individually receiving a supply of an electric current from the gradient power supply 104, each of the three coils is configured to generate a gradient magnetic field of which the magnetic field intensity changes along the corresponding one of the X-, Y-, and Z-axes. The gradient magnetic fields generated by the gradient coil 103 along the X-, Y-, and Z-axes are referred to as, for example, a slice gradient magnetic field Gs, a phase encode gradient magnetic field Ge, and a readout gradient magnetic field Gr. The gradient power supply 104 is configured to supply the electric current to the gradient coil 103.

The couch 105 includes a couchtop 105a on which the patient P is placed. Under control of the couch controlling circuitry 106, the couchtop 105a is inserted into the hollow (an image taking opening) of the gradient coil 103, while the patient P is placed thereon. Normally, the couch 105 is installed so that the longitudinal direction thereof extends parallel to the central axis of the static magnetic field magnet 101. Under control of the image processing device 130, the couch controlling circuitry 106 is configured to drive the couch 105 so as to move the couchtop 105a in longitudinal directions and up-and-down directions.

The transmission coil 107 is arranged on the inside of the gradient coil 103 and is configured to generate a radio frequency magnetic field by receiving a supply of an RF pulse from the transmitter circuitry 108. The transmitter circuitry 108 is configured to supply the RF pulse corresponding to a Larmor frequency determined by the type of targeted atoms and the magnetic field intensity, to the transmission coil 107.

The reception coil 109 is arranged on the inside of the gradient coil 103 and is configured to receive magnetic resonance signals (which hereinafter may be referred to as "MR signals" as necessary) emitted from the patient P due to influence of the radio frequency magnetic field. Upon receipt of the magnetic resonance signals, the reception coil 109 is configured to output the received magnetic resonance signals to the receiver circuitry 110.

The transmission coil 107 and the reception coil 109 described above are merely examples. The configuration may be realized by using one or a combination of two or more selected from among: a coil having only transmitting functions, a coil having only receiving functions, and a coil having transmitting and receiving functions.

The receiver circuitry 110 is configured to detect the magnetic resonance signals output from the reception coil 109 and to generate magnetic resonance data based on the detected magnetic resonance signals. More specifically, the receiver circuitry 110 is configured to generate the magnetic resonance data by performing a digital conversion on the magnetic resonance signals output from the reception coil 109. Further, the receiver circuitry 110 is configured to transmit the generated magnetic resonance data to the sequence controlling circuitry 120. Alternatively, the receiver circuitry 110 may be provided so as to belong to a gantry device including the static magnetic field magnet 101, the gradient coil 103, and the like.

The sequence controlling circuitry 120 is configured to perform an imaging process on the patient P, by driving the gradient power supply 104, the transmitter circuitry 108, and the receiver circuitry 110, based on sequence information transmitted thereto from the image processing device 130. In this situation, the sequence information is information defining a procedure for performing the imaging process. The sequence information defines: the intensity of the electric current to be supplied by the gradient power supply 104 to the gradient coil 103 and the timing with which the electric current is to be supplied; the intensity of the RF pulse to be supplied by the transmitter circuitry 108 to the transmission coil 107 and the timing with which the RF pulse is to be applied; the timing with which the magnetic resonance signal is detected by the receiver circuitry 110; and the like. For example, the sequence controlling circuitry 120 may be an integrated circuit such as an Application Specific Integrated Circuit (ASIC) or a Field Programmable Gate Array (FPGA) or an electronic circuit such as a Central Processing Unit (CPU) or a Micro Processing Unit (MPU). Details of pulse sequences executed by the sequence controlling circuitry 120 will be explained later.

Further, upon receipt of the magnetic resonance data from the receiver circuitry 110 as a result of the imaging process performed on the patient P by driving the gradient power supply 104, the transmitter circuitry 108, and the receiver circuitry 110, the sequence controlling circuitry 120 is configured to transfer the received magnetic resonance data to the image processing device 130.

The image processing device 130 is configured to control the entirety of the magnetic resonance imaging apparatus 100, to generate images, and the like. The image processing device 130 includes a memory 132, an input device 134, a display 135, and processing circuitry 150. The processing circuitry 150 includes an interface function 131, a controlling function 133, and a generating function 136.

In the first embodiment, the processing functions performed by the interface function 131, the controlling function 133, and the generating function 136 are stored in the memory 132 in the form of computer-executable programs. The processing circuitry 150 is a processor configured to realize the functions corresponding to the programs, by reading and executing the programs from the memory 132. In other words, the processing circuitry 150 that has read the programs has the functions illustrated within the processing circuitry 150 in FIG. 1. Although the example is explained with reference to FIG. 1 in which the single processing circuit (i.e., the processing circuitry 150) realizes the processing functions performed by the interface function 131, the controlling function 133, and the generating function 136, it is also acceptable to structure the processing circuitry 150 by combining together a plurality of independent processors, so that the functions are realized as a result of the processors executing the programs. In other words, each of the abovementioned functions may be structured as a program, so that the single processing circuit (the processing circuitry 150) executes the programs. In another example, one or more specific functions may each be installed in a dedicated and independent program executing circuit. Further, in FIG. 1, the interface function 131, the controlling function 133, and the generating function 136 are examples of a receiving unit, a controlling unit, and a generating unit, respectively. Further, the sequence controlling circuitry 120 is an example of a sequence controlling unit.

The term "processor" used in the above explanations denotes, for example, a Central Processing Unit (CPU), a Graphical Processing Unit (GPU), or a circuit such as an Application Specific Integrated Circuit (ASIC) or a programmable logic device (e.g., a Simple Programmable Logic Device [SPLD], a Complex Programmable Logic Device [CPLD], or a Field Programmable Gate Array [FPGA]). The one or more processors are configured to realize the functions by reading and executing the programs saved in the memory 132.

Further, instead of saving the programs in the memory 132, it is also acceptable to directly incorporate the programs in the circuits of the one or more processors. In that situation, the one or more processors realize the functions by reading and executing the programs incorporated in the circuits thereof. Similarly, the couch controlling circuitry 106, the transmitter circuitry 108, the receiver circuitry 110, and the like are each also configured by using an electronic circuit like the abovementioned processor.

By employing the interface function 131, the processing circuitry 150 is configured to transmit the sequence information to the sequence controlling circuitry 120 and to receive the magnetic resonance data from the sequence controlling circuitry 120. Further, upon receipt of the magnetic resonance data, the processing circuitry 150 including the interface function 131 is configured to store the received magnetic resonance data into the memory 132.

The magnetic resonance data stored in the memory 132 is arranged in a k-space by the controlling function 133. As a result, the memory 132 stores therein k-space data.

The memory 132 is configured to store therein the magnetic resonance data received by the processing circuitry 150 including the interface function 131, the k-space data arranged in the k-space by the processing circuitry 150 including the controlling function 133, image data generated by the processing circuitry 150 including the generating function 136, and the like. For example, the memory 132 may be a semiconductor memory element such as a Random Access Memory (RAM) or a flash memory, or a hard disk, an optical disk, or the like.

The input device 134 is configured to receive various types of instructions and inputs of information from an operator. For example, the input device 134 is a pointing device such as a mouse or a trackball, a selecting device such as a mode changing switch, and/or an input device such as a keyboard. Under control of the processing circuitry 150 including the controlling function 133, the display 135 is configured to display a Graphical User Interface (GUI) used for receiving an input of an image taking condition, images generated by the processing circuitry 150 including the generating function 136, and the like. For example, the display 135 is a display such as a liquid crystal display monitor.

By employing the controlling function 133, the processing circuitry 150 is configured to control the entirety of the magnetic resonance imaging apparatus 100 and to control image taking processes, image generating processes, image displaying processes, and the like. For example, the processing circuitry 150 including the controlling function 133 is configured to receive the input of the image taking condition (e.g., an image taking parameter) through the GUI and to generate the sequence information according to the received image taking condition. Further, the processing circuitry 150 including the controlling function 133 is configured to transmit the generated sequence information to the sequence controlling circuitry 120.

By employing the generating function 136, the processing circuitry 150 is configured to generate an image by reading the k-space data from the memory 132 and performing a reconstructing process such as a Fourier transform on the read k-space data.

Next, a background of an embodiment will briefly be explained.

Perfusion techniques are used for rendering hemodynamics of capillaries in a tissue by using an Arterial Spin Labeling (ASL) method by which an RF pulse is radiated onto blood vessels so as to invert blood spins and to use the inverted spins as an endogenous tracer. Known examples of the perfusion techniques include a Flow-sensitive Alternating Inversion Recovery (FAIR) method, a Continuous Arterial Spin Labeling (CASL) method, and a pulsed-Continuous Arterial Spin Labeling (pCASL) method.

The FAIR method is basically a two-dimensional imaging method by which an imaging process is performed by applying a spatially selective pulse to a ROI slice. Although the FAIR method has an advantage of achieving a high SNR, a problem remains where, when a spatially selective IR pulse has repeatedly been applied, the perfusion curve fails to return to the original baseline thereof.

Further, by continuously applying a spatially selective pulse, the pCASL method is able to achieve a high SNR similarly to the FAIR method. However, the pCASL method has the problem where, when a spatially selective IR pulse has repeatedly been applied, the perfusion curve fails to return to the original baseline thereof. In addition, another problem arises where it is necessary to suppress the Magnetization Transfer (MT) effect.

For the reasons stated above, with the perfusion techniques using an ASL method, how to suppress the MT effect is important.

In relation to the above, among ASL methods, configurations to apply a spatially non-selective IR pulse have not been mainstream methods, because spatially non-selective IR pulses can easily lower the SN ratios of images. However, we have discovered that applying a spatially non-selective IR pulse significantly suppresses the MT effect. One of the reasons is that, although a larger MT effect is exerted on magnetization while spins are aligned along the direction of a magnetic field (+Mz), a smaller MT effect is exerted on longitudinal magnetization of longitudinal magnetization in the opposite direction (−Mz).

Accordingly, the magnetic resonance imaging apparatus 100 according to an embodiment is configured to execute two pulse sequences, namely, a pulse sequence in which a spatially non-selective pulse is applied, and subsequently an acquisition sequence is executed and another pulse sequence in which a spatially non-selective pulse and a spatially selective pulse are applied and subsequently an acquisition sequence is executed and is configured to generate a magnetic resonance image by calculating a difference between pieces of data acquired from the two pulse sequences. In this situation, as the acquisition sequence, the sequence controlling circuitry 120 performs a Cartesian acquisition and subsequently performs a radial acquisition, in an example.

As a result, it is possible to suppress the MT effect and to apply ASL to a site other than the heart, which has hitherto been considered difficult. It is therefore possible to perform four-dimensional (4D) non-contrast-enhanced ASL imaging on, for example, a region in the brain, a muscle, or a kidney, a region including a region having microvascularization, or a region including a region having microcirculation.

In addition, it is possible to perform a preliminary imaging process with respect to a plurality of TI values and to determine an optimal TI value based on the results thereof. It is therefore possible to improve throughput of medical examinations.

Further, by combining the 4D non-contrast-enhanced ASL imaging with Magnetic Resonance Angiography (MRA), it is expected possible to predict of a stenosis or an occlusion of a blood vessel with a high level of precision.

A configuration to realize this example will be explained with reference to FIGS. 2 to 5.

FIG. 2 is a flowchart for explaining a flow in a process performed by the magnetic resonance imaging apparatus according to the first embodiment.

To begin with, at step S100, the sequence controlling circuitry 120 executes: a first pulse sequence in which a spatially selective IR pulse and a spatially non-selective IR pulse are applied and subsequently a radial acquisition is performed; and a second pulse sequence in which a spatially non-selective IR pulse is applied without applying a spatially selective IR pulse, and subsequently a radial acquisition is performed.

This procedure will be explained with reference to FIGS. 3A to 3E.

Figure 3B:
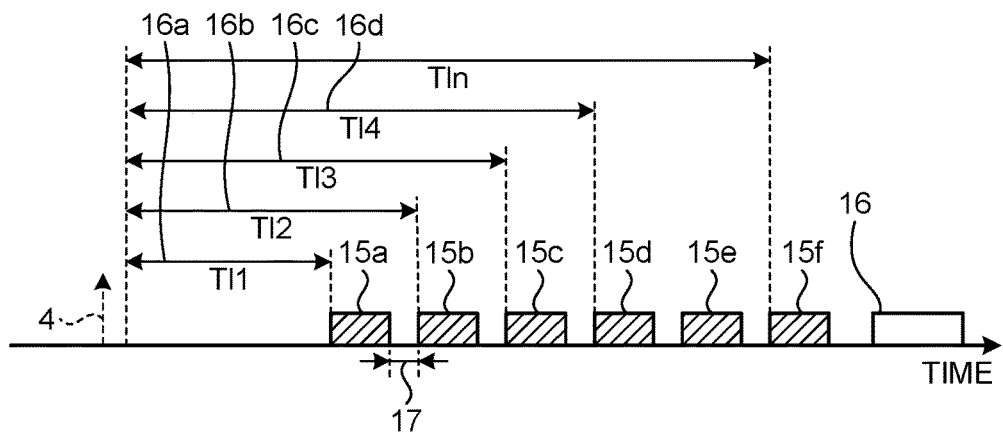

FIG. 3A illustrates the first pulse sequence in which the spatially selective IR pulse and the spatially non-selective IR pulse are applied, and subsequently the radial acquisition is performed. FIG. 3B illustrates the second pulse sequence in which, without applying a spatially selective IR pulse, the radial acquisition is performed. The first pulse sequence in which the spatially selective IR pulse and the spatially non-selective IR pulse are applied, and subsequently the radial acquisition is performed may be referred to as a Tag-ON sequence. In contrast, the second pulse sequence in which, without applying a spatially selective IR pulse, the radial acquisition is performed may be referred to as a Tag-OFF sequence.

In the following sections, an example will be explained with reference to FIGS. 3A and 3B in which the acquisition sequences executed by the sequence controlling circuitry 120 at step S100 are for minimizing acoustic noise utilizing Ultrashort Echo Time (mUTE). Usually, the sequence controlling circuitry 120 is configured to link together the Tag-ON sequence in FIG. 3A and the Tag-OFF sequence in FIG. 3B, so as to execute the linked sequences as a set of acquisitions.

As illustrated in FIG. 3A, the sequence controlling circuitry 120 performs a magnetic resonance imaging process on an imaged region, by executing the first pulse sequence in which a spatially non-selective IR pulse 4, which is an RF pulse to invert nuclear spins in a wider region, is applied to a wider region including the imaged region, and subsequently, a spatially selective IR pulse 5, which is an RF pulse to invert nuclear spins in a specific region, is applied to a smaller region than the application region of the spatially non-selective IR pulse 4, and when a prescribed time period has elapsed, the acquisition sequence to acquire data is executed.

Figure 3C:
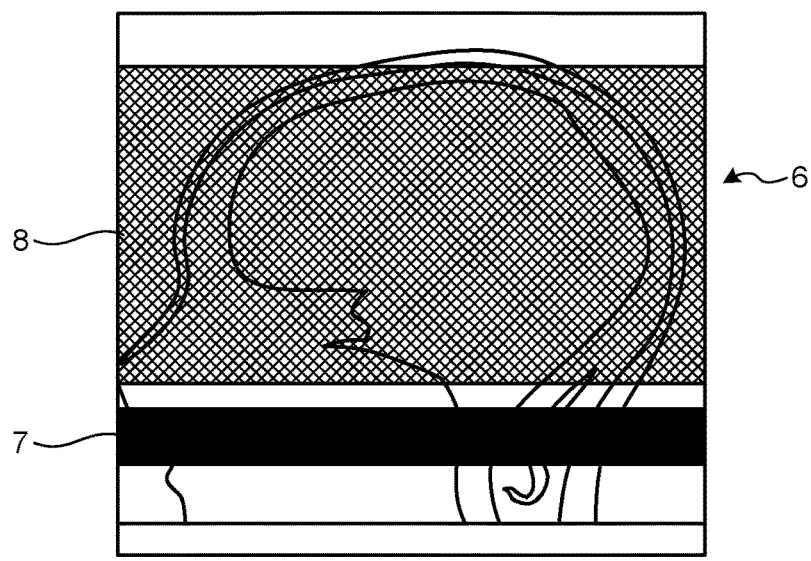
FIG. 3C is a drawing for explaining application regions of Radio Frequency (RF) pulses applied by the magnetic resonance imaging apparatus according to the first embodiment.

At first, the application regions of the spatially non-selective IR pulse 4 and the spatially selective IR pulse 5 will be explained, with reference to FIG. 3C. In this situation, a region 8 denotes the imaged region, which is the region subject to the imaging process and the region from which the data is to be acquired with the acquisition sequence executed by the sequence controlling circuitry 120 after the spatially non-selective IR pulse 4 and the spatially selective IR pulse 5 are applied. Further, a region 6 denotes the region to which the spatially non-selective IR pulse is applied by the sequence controlling circuitry 120. The sequence controlling circuitry 120 is configured to apply the spatially non-selective IR pulse 4 to the wider region 6 including the region 8 serving as the imaged region. Further, a region 7 denotes the region to which the spatially selective IR pulse 5 is applied by the sequence controlling circuitry 120. The sequence controlling circuitry 120 is configured to apply the spatially selective IR pulse 5 to the region 7, which is a relatively smaller region. The region 7 to which the spatially selective IR pulse 5 is applied by the sequence controlling circuitry 120 is, for example, selected on the upstream side of the region 8 serving as the imaged region. In other words, blood that is present in the region 7 at the time of applying the spatially selective IR pulse 5 and is present in the region 8 at the time of executing the acquisition sequence is labeled.

Figure 3D:
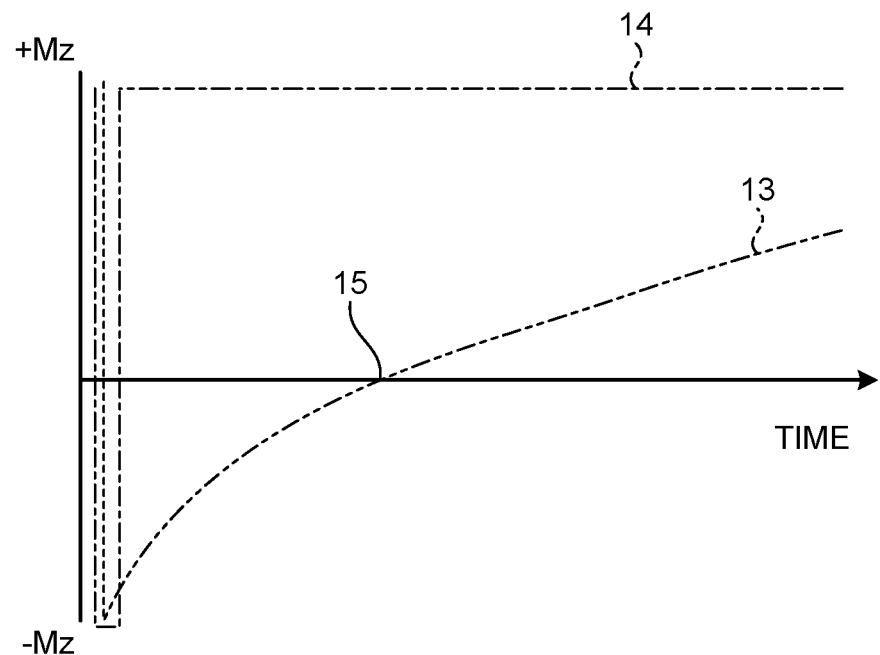
FIG. 3D is a drawing for explaining changes in longitudinal magnetization caused by the RF pulses applied by the magnetic resonance imaging apparatus according to the first embodiment.

Next, changes in longitudinal magnetization of spins caused by the applications of the spatially non-selective IR pulse 4 and the spatially selective IR pulse 5 will be explained, with reference to FIG. 3D. FIG. 3D is a drawing for explaining temporal changes in the longitudinal magnetization of the spins.

The plotline 14 indicates temporal changes in the longitudinal magnetization of the spins in a location to which both the spatially non-selective IR pulse 4 and the spatially selective IR pulse 5 are applied. The plotline 13 indicates temporal changes in the longitudinal magnetization of the spins in a location to which only the spatially non-selective IR pulse 4 is applied, while the spatially selective IR pulse 5 is not applied.

Both the spatially non-selective IR pulse 4 and the spatially selective IR pulse 5 invert the longitudinal magnetization of the location to which the RF pulse is applied. Accordingly, in the location to which both the spatially non-selective IR pulse 4 and the spatially selective IR pulse 5 are applied, i.e., the labeled location, the longitudinal magnetization is inverted twice so that the longitudinal magnetization returns to the original value and exhibits a high signal, as indicated by the plotline 14.

In contrast, in the location to which only the spatially non-selective IR pulse 4 is applied, while the spatially selective IR pulse 5 is not applied, i.e., the location such as a background part, the signal of the longitudinal magnetization is inverted by the RF pulse only once, and the signal gradually relaxes, as indicated by the plotline 13. In this situation, the longitudinal magnetization value is equal to zero at a null point 15. Accordingly, when the sequence controlling circuitry 120 executes the acquisition sequence in the vicinity of the null point 15, because the blood labeled by the spatially selective IR pulse 5 exhibits a high signal, it is possible to perform the imaging process while suppressing background signals. A purpose of the spatially non-selective IR pulse 4 and the spatially selective pulse 5 applied by the sequence controlling circuitry 120 has thus been explained.

Next, with reference back to FIG. 3A, the acquisition sequence executed by the sequence controlling circuitry 120 will be explained. In the first embodiment, the sequence controlling circuitry 120 performs a 4D acquisition. In this situation, the 4D acquisition denotes performing a three-dimensional (3D) acquisition on the k-space while varying the TI periods, so as to perform acquisition four-dimensionally in total. In other words, by varying the TI period to be different values, the sequence controlling circuitry 120 is configured to acquire data with respect to a plurality of TI periods each of which denotes the time since the spatially non-selective pulse 4 or the spatially selective pulse 5 is applied. In this situation, for example, the sequence controlling circuitry 120 acquires the data by using a mUTE sequence as the acquisition sequence. In other words, in the first embodiment, the acquisition sequence executed by the sequence controlling circuitry 120 includes: acquisitions in a plurality of Cartesian segments such as Cartesian acquisitions 15a, 15b, 15c, 15d, 15e, and 15f performed on a central part of the space; and a radial acquisition 16 performed on an outside part of the k-space. In other words, after applying the spatially non-selective IR pulse 4 and the spatially selective IR pulse 5, the sequence controlling circuitry 120 performs the Cartesian acquisition 15a when time 16a has elapsed, performs the Cartesian acquisition 15b when time 16b has elapsed, performs the Cartesian acquisition 15c when time 16c has elapsed, performs the Cartesian acquisition 15d when time 16d has elapsed, similarly performs the Cartesian acquisitions 15e and 15f, and subsequently performs the radial acquisition 16.

Figure 3E:
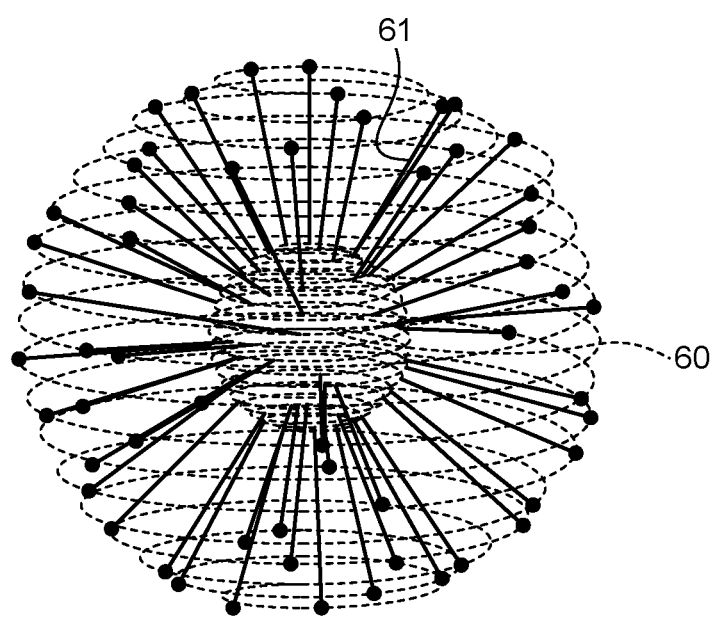
FIG. 3E is a drawing for explaining k-space data acquisition performed by the magnetic resonance imaging apparatus according to the first embodiment.

FIG. 3E illustrates a relationship between the Cartesian acquisitions and the radial acquisition performed by the sequence controlling circuitry 120. FIG. 3E three-dimensionally illustrates the region of the k-space where the data acquisition is performed. A region 60 represents the central part of the k-space where the Cartesian acquisitions are performed. Each of the line segments such as a line segment 61 indicates the radial acquisition performed by the sequence controlling circuitry 120. In other words, in the executed acquisition sequence, the sequence controlling circuitry 120 at first performs the Cartesian acquisitions 15a, 15b, 15c, 15d, 15e, and 15f, on the region 60 in the central part of the k-space while varying the TI value, and subsequently performs the radial acquisition 16 on the region outside the region 60 positioned in the central part of the k-space, toward the outside from the center of the k-space, for example. In this manner, the sequence controlling circuitry 120 has executed the first pulse sequence.

At step S110 explained later, by employing the generating function 136, the processing circuitry 150, for example, generates data related to TI=TI1 being the TI corresponding to the time 16a by using the acquisition from the cartesian acquisition 15a and the radial acquisition 16, further generates data related to TI=TI2 being the TI corresponding to the time 16b by using the acquisition from the cartesian acquisition 15b and the radial acquisition 16, and generates data related to TI=TI3 being the TI corresponding to the time 16c by using the acquisition from the cartesian acquisition 15c and the radial acquisition 16.

Similarly as illustrated in FIG. 3B, in the second pulse sequence, after applying only the spatially non-selective IR pulse 4 without applying the spatially selective IR pulse 5, the sequence controlling circuitry 120 performs a cartesian acquisition 15a when the time 16a has elapsed, performs a cartesian acquisition 15b when the time 16b has elapsed, performs a Cartesian acquisition 15c when the time 16c has elapsed, performs a Cartesian acquisition 15d when the time 16d has elapsed, similarly performs Cartesian acquisitions 15e and 15f, and subsequently performs a radial acquisition 16. The only difference between the first pulse sequence and the second pulse sequence is the presence/absence of the application of the spatially selective pulse 5, and the other processes are the same.

Figure 4:
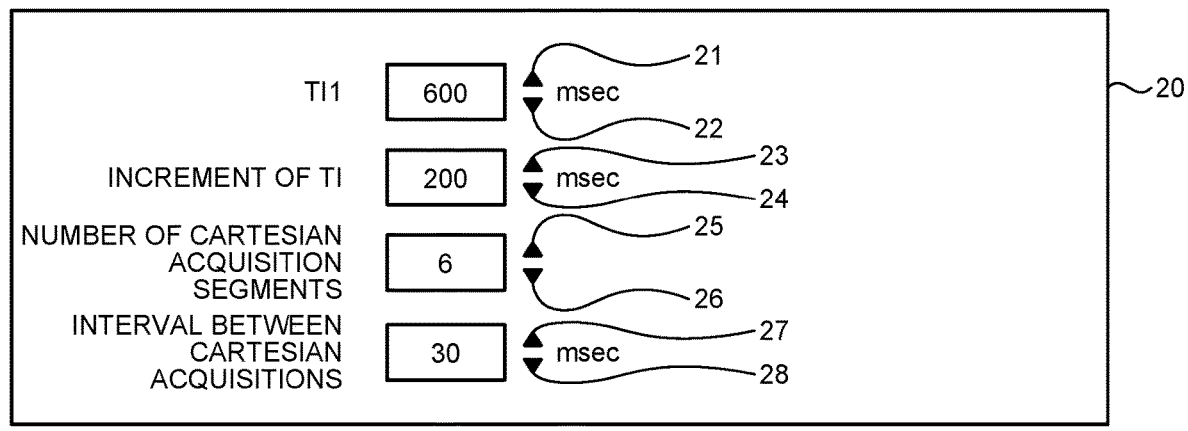
FIG. 4 is a drawing for explaining a Graphical User Interface (GUI) related to the magnetic resonance imaging apparatus according to the first embodiment.

In FIGS. 3A and 3B, the time TI1, TI2, TI3, TI4 and so on, which denote the time from the application of the spatially non-selective pulse 4 or the spatially selective pulse 5 to the execution of the Cartesian acquisitions 15a, 15b, 15c, 15d, 15e, and 15f, are variable and may arbitrarily be set in accordance with instructions from the user. FIG. 4 illustrates an example of a GUI for this purpose.

By employing the controlling function 133, the processing circuitry 150 receives a change made to TI1, i.e., an input of the time 16a in FIGS. 3A and 3B, via the input device 134 and buttons 21 and 22 on an input panel 20 of the display 135. Further, by employing the controlling function 133, the processing circuitry 150 receives a change made to an increment of the TI, e.g., an input of the increment from TI1 to TI2 illustrated in FIGS. 3A and 3B, via the input device 134 and buttons 23 and 24 on the input panel 20 of the display 135. Further, by employing the controlling function 133, the processing circuitry 150 receives a change made to the number of cartesian acquisition segments, via the input device 134 and buttons 25 and 26 on the input panel 20 of the display 135. In this situation, the number of Cartesian acquisition segments denotes the number of Cartesian acquisition segments corresponding to mutually-different TI values. In the example illustrated in FIGS. 3A and 3B, the number of Cartesian acquisition segments is six. Further, by employing the controlling function 133, the processing circuitry 150 receives a change made to a Cartesian acquisition interval via the input device 134 and buttons 27 and 28 on the input panel 20 of the display 135. In this situation, the Cartesian acquisition interval denotes the interval between the Cartesian acquisitions performed by the sequence controlling circuitry 120. An interval 17 illustrated in FIG. 3B is the Cartesian acquisition interval.

Subsequently, at step S120, by employing the generating function 136, the processing circuitry 150 generates a magnetic resonance image in which the MT effect is suppressed, based on the data obtained from the first pulse sequence and the second pulse sequence executed by the sequence controlling circuitry 120 at step S100. More specifically, by employing the generating function 136, the processing circuitry 150 generates a first image (a Tag-ON image) by performing a Fourier transform on first k-space data obtained by executing the first pulse sequence being a Tag-ON sequence.

For example, by employing the generating function 136, the processing circuitry 150 generates data related to TI=TI1, based on the data obtained from the Cartesian acquisition 15a and the data obtained from the radial acquisition 16 in FIG. 3A. Similarly, by employing the generating function 136, the processing circuitry 150 generates data related to TI=TI2, based on the data obtained from the Cartesian acquisition 15b and the data obtained from the radial acquisition 16 in FIG. 3A. Further, by employing the generating function 136, the processing circuitry 150 generates data related to TI=TI3, based on the data obtained from the Cartesian acquisition 15c and the data obtained from the radial acquisition 16 in FIG. 3A. In this manner, the processing circuitry 150 generates the pieces of data related to the plurality of TI values, based on the pieces of data obtained by executing the first pulse sequence.

Further, by employing the generating function 136, the processing circuitry 150 generates a second image (a Tag-OFF image) by performing a Fourier transform on second k-space data obtained by executing the second pulse sequence being a Tag-OFF sequence. Subsequently, the processing circuitry 150 generates a magnetic resonance image in which the background signal and the MT effect are suppressed by performing a difference calculating process between the first image (the Tag-ON image) and the second image (the Tag-OFF image).

For example, by employing the generating function 136, the processing circuitry 150 generates data related to TI being equal to TI1, based on the data obtained from the Cartesian acquisition 15a and the data obtained from the radial acquisition 16 in FIG. 3B. Similarly, by employing the generating function 136, the processing circuitry 150 generates data related to TI being equal to TI2, based on the data obtained from the Cartesian acquisition 15b and the data obtained from the radial acquisition 16 in FIG. 3B. Further, by employing the generating function 136, the processing circuitry 150 generates data related to TI being equal to TI3, based on the data obtained from the Cartesian acquisition 15c and the data obtained from the radial acquisition 16 in FIG. 3B. In this manner, the processing circuitry 150 has generated the pieces of data related to the plurality of TI values, based on the pieces of data obtained by executing the first pulse sequence.

As explained above, in the magnetic resonance imaging apparatus 100 according to the first embodiment, the 4D ASL sequence is executed by applying the spatially non-selective IR pulse. As a result, it is possible to suppress the MT effect and is therefore possible to apply ASL to a site other than the heart, which has hitherto been considered difficult. For example, it is possible to perform the imaging process on an imaged region such as a region in the brain, a muscle, or a kidney, a region including a region having microvascularization, or a region including a region having microcirculation.

The example was explained with reference to FIGS. 3A and 3B in which the radial acquisition 16 is performed after the Cartesian acquisitions 15a to 15f; however, possible embodiments are not limited to this example. The radial acquisition 16 may be performed before the Cartesian acquisitions 15a to 15f. In other words, the radial acquisition 16 may be performed before the application of the ASL pulse.

In addition, by further analyzing the magnetic resonance image generated at step S110, the processing circuitry 150 is capable of distinguishing a normal blood flow from a blood vessel having a stenosis, being ischemic, having an occlusion, having an infarct, or having been revascularized/treated.

In an example, by employing the generating function 136, the processing circuitry 150 is configured to calculate, with respect to the imaged region, at least one of a peak signal value, a peak flow time, arterial transit time, and a blood flow volume, as an index, based on the data obtained from the first pulse sequence and the second pulse sequence executed by the sequence controlling circuitry 120 at step S100 and is configured to further perform the analysis based on the calculated index.

Figure 5:
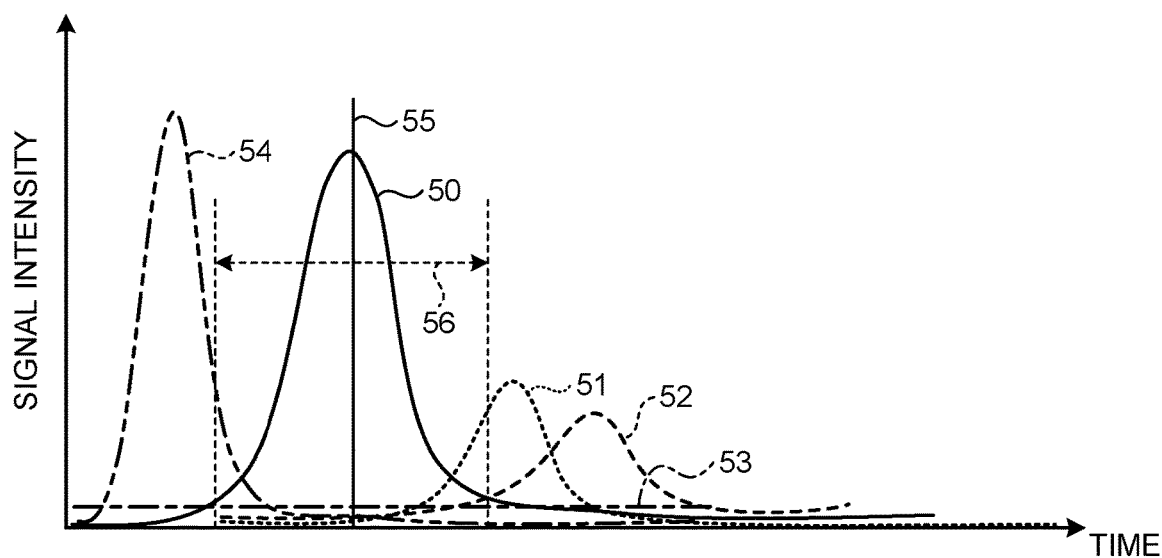
FIG. 5 is a chart for explaining a process performed by the magnetic resonance imaging apparatus according to the first embodiment.

FIG. 5 illustrates an example of the analysis. FIG. 5 illustrates temporal changes in signal values observed after the difference calculating process performed between the first image and the second image, in various status of blood vessels, with respect to a given imaged region. More specifically, the curve 50 indicates temporal changes in the signal value of a normal blood flow. The curve 51 indicates temporal changes in the signal value of a blood flow in a blood vessel in a stenosed/ischemic state. The curve 52 indicates temporal changes in the signal value of a blood flow in a blood vessel having a tighter stenosis. The curve 53 indicates temporal changes in the signal value of a blood flow in a blood vessel in an occluded/infarct state. The curve 54 indicates temporal changes in the signal value of a blood flow in a blood vessel that has been revascularized/treated.

In this situation, as for the peak flow time at which the signal value of a blood flow exhibits a maximum value, it is observed in comparison with a peak flow time 55 of the signal value of the blood flow in the normal blood vessel, the peak flow time of the curve 51 indicating the signal value of the blood flow in the blood vessel in the stenosis/ischemic state has the TI shifted to later and thus has a slower blood flow. Further, the peak flow time of the curve 52 indicating the signal value of the blood flow in the blood flow having a tighter stenosis is further later than the peak flow time of the curve 51. Conversely, the peak flow time of the curve 54 indicating the signal value of the blood flow in the blood vessel that has been revascularized/treated is shifted in the direction of smaller TI values, compared to the peak flow time 55 of the signal value of the blood flow in the normal blood vessel. As explained herein, the processing circuitry 150 is able to predict the degree of a stenosis or an occlusion of the blood vessel while employing the generating function 136, by utilizing the notion that the peak flow time of the signal value varies depending on the degree of a stenosis or an occlusion in the blood vessel. In other words, by employing the generating function 136, the processing circuitry 150 is able to predict the degree of the stenosis or the occlusion in the blood vessel, based on the index acquired based on the data obtained from the first pulse sequence and the second pulse sequence executed by the sequence controlling circuitry 120 at step S100.

The example was explained above in which, by employing the generating function 136, the processing circuitry 150 is configured to predict the degree of the stenosis or the occlusion of the blood vessel by using the peak flow time as an index; however, possible embodiments are not limited to this example. In other examples, by employing the generating function 136, the processing circuitry 150 may predict the degree of a stenosis or an occlusion of the blood vessel by using, as an index, a peak signal value, arterial transit time (ATT) 56, or a blood flow volume obtained by calculating the area of the part defined by the curve and the horizontal axis (the time axis). For example, a tighter stenosis exhibits a delayed peak flow time, a smaller peak signal value, and longer ATT, the sequence controlling circuitry 120 is able to predict the degree of a stenosis or an occlusion of the blood vessel based on these characteristics. In particular, the magnetic resonance imaging apparatus 100 according to the embodiment is capable of efficiently eliminating the background signal and the MT signal by performing the difference calculating process on the images obtained from the two pulse sequences executed with the application of the spatially non-selective IR pulse. Consequently, by employing the generating function 136, the sequence controlling circuitry 120 is able to detect even a tight stenosis equal to or smaller than 50% of the diameter of the blood vessel, based on the index.

As explained above, the magnetic resonance imaging apparatus according to the first embodiment is able to obtain a perfusion signal in which the MT effect is suppressed.

Modification Examples of First Embodiment

In the first embodiment, the example was explained in which the sequence controlling circuitry 120 implements the process of minimizing acoustic noise utilizing Ultrashort Echo Time (mUTE); however, possible embodiments are not limited to this example. The sequence controlling circuitry 120 may execute any of various types of 2D and 3D acquisition sequences, such as a Fast Spin Echo (FSE) method, a Fast Asymmetric Spin Echo (FASE) method, balanced Steady State Free Precession (bSSFP), an Ultrashort Echo Time (UTE) method, an Echo Planar Imaging (EPI) method, or the like.

Further, for the imaging process, the sequence controlling circuitry 120 may implement electrocardiographic synchronization.

Figure 6A:
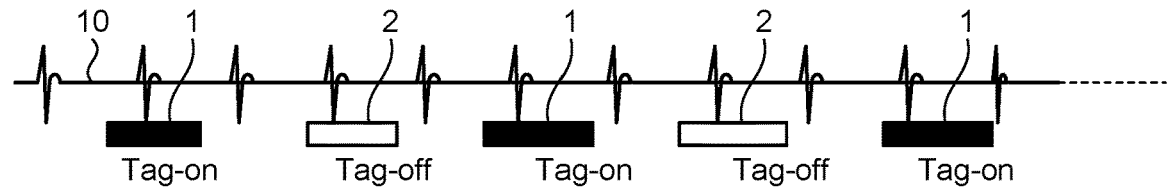
FIGS. 6A, 6B, and 6C are charts for explaining pulse sequences executed by a magnetic resonance imaging apparatus according to a modification example of the first embodiment.
Figure 6B:
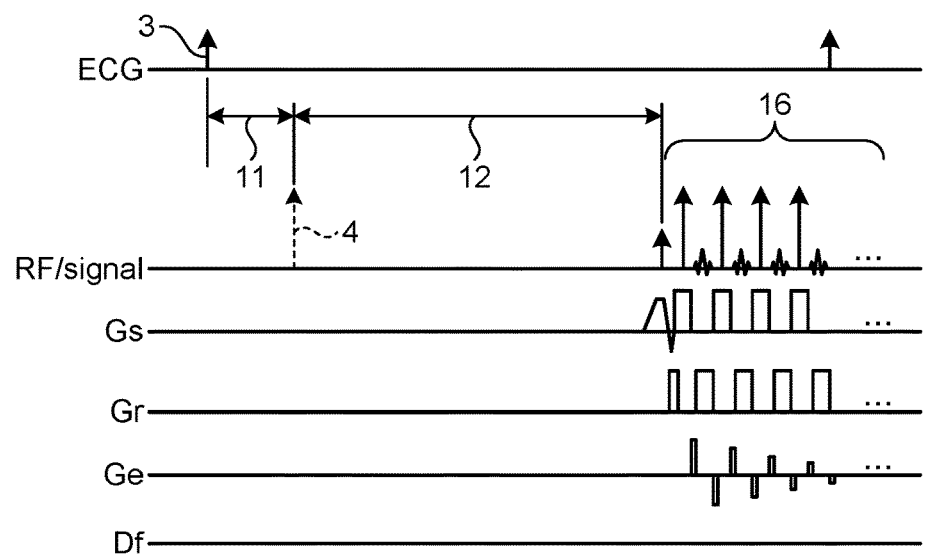
Figure 6C:
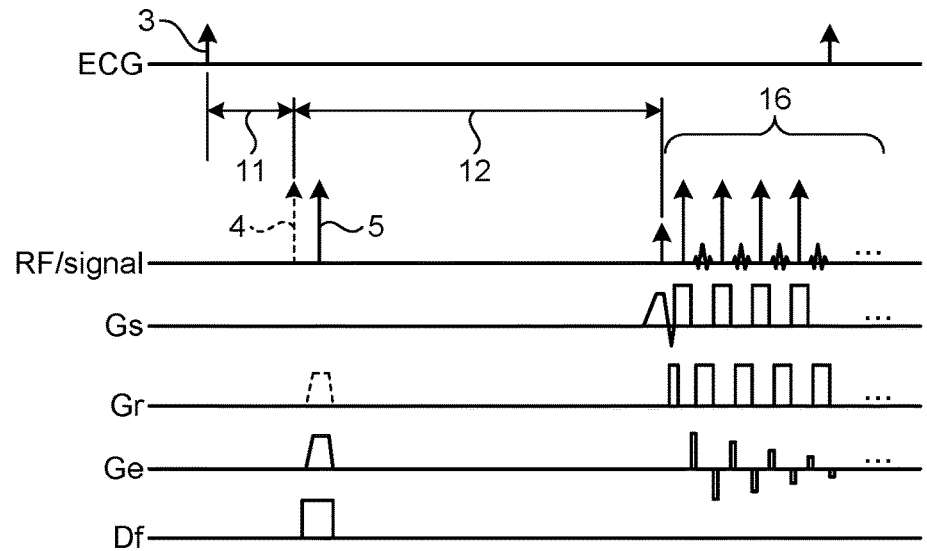

FIGS. 6A, 6B, and 6C illustrate examples thereof.

As schematically illustrated in FIG. 6A, when the sequence controlling circuitry 120 is configured to implement the electrocardiographic synchronization, the sequence controlling circuitry 120 alternately executes a Tag-ON sequence 1 and a Tag-OFF sequence 2 in synchronization with an electrocardiogram 10. In this situation, FIG. 6B illustrates an example of the Tag-ON sequence 1, whereas FIG. 6C illustrates an example of the Tag-OFF sequence 2. In this situation, as for the processes other than the electrocardiographic synchronization, the sequence controlling circuitry 120 and the processing circuitry 150 perform the same processes as those in the first embodiment.

In other words, as illustrated in FIG. 6B, the sequence controlling circuitry 120 applies the spatially non-selective pulse 4 when a prescribed time period 11 has elapsed since an R-wave 3 and executes an acquisition sequence 16 when a prescribed time period 12 has elapsed since the application of the spatially non-selective pulse 4.

Further, as illustrated in FIG. 6C, the sequence controlling circuitry 120 applies the spatially non-selective pulse 4 and the spatially selective pulse 5 when the prescribed time period 11 has elapsed since an R-wave 3 and executes an acquisition sequence 16 when the prescribed time period 12 has elapsed since the application of the spatially non-selective pulse 4 and the spatially selective pulse 5.

Second Embodiment

In a second embodiment, an example will be explained in which, similarly to the first embodiment, the sequence controlling circuitry 120 performs an imaging process while applying the spatially non-selective pulse in both a Tag-ON sequence and a Tag-OFF sequence, but performs prior to a main imaging process, a preliminary scan multiple times for understanding an optimal TI period while varying the TI period. As a result, it is possible to perform the main imaging process by using the TI period that is most appropriate for the purpose of the imaging process.

Next, this process will be explained with reference to FIG. 7. FIG. 7 is a flowchart illustrating a processing procedure performed by a magnetic resonance imaging apparatus according to the second embodiment. In FIG. 7, duplicate explanations of the parts having the same processes as those in the first embodiment will be omitted.

To begin with, at step S200, the sequence controlling circuitry 120 executes the first pulse sequence being a Tag-ON pulse sequence and the second pulse sequence being a Tag-OFF pulse sequence, while applying the spatially non-selective IR pulse and varying the TI period, with respect to a plurality of TI periods.

FIG. 8 illustrates an example of this process.

As illustrated in FIG. 8, the sequence controlling circuitry 120 executes: the Tag-ON sequence 1 being the first pulse sequence in which the spatially selective IR pulse 5 and the spatially non-selective IR pulse 4 are applied, and subsequently, a data acquisition 16 is performed when the first TI period has elapsed; and the Tag-OFF sequence 2 being the second pulse sequence in which the spatially non-selective IR pulse 4 is applied without applying the spatially selective IR pulse 5, and subsequently, a data acquisition 16 is performed when the TI period has elapsed, while varying the TI period, with respect to a plurality of TI periods e.g., TI periods 16a, 16b, and so on. In this situation, for example, the sequence controlling circuitry 120 executes: the Tag-ON sequence 1 being the first pulse sequence in which the spatially selective IR pulse 5 and the spatially non-selective IR pulse 4 are applied, and subsequently, a Cartesian acquisition is performed when the TI period has elapsed, and a radial acquisition is performed after the Cartesian acquisition; and the Tag-OFF sequence 2 being the second pulse sequence in which the spatially non-selective IR pulse is applied without applying the spatially selective IR pulse, and subsequently, a Cartesian acquisition is performed when the TI period has elapsed, and a radial acquisition is performed after the Cartesian acquisition, while varying the TI period, with respect to the plurality of TI periods e.g., the TI periods 16a, 16b, and so on.

After that, at step S210, by employing the generating function 136, the processing circuitry 150 calculates, based on data obtained from the first pulse sequence and the second pulse sequence, a TI period or a set of TI periods to be used in a third pulse sequence being a Tag-ON sequence and a fourth pulse sequence being a Tag-OFF sequence that will be executed by the sequence controlling circuitry 120 at step S220. In this situation, an example of the pulse sequence executed as the third pulse sequence being the Tag-ON sequence to be executed by the sequence controlling circuitry 120 at step S220 is the pulse sequence in FIG. 3A explained in the first embodiment. Further, an example of the pulse sequence executed as the fourth pulse sequence being the Tag-OFF sequence to be executed by the sequence controlling circuitry 120 at step S230 is the pulse sequence in FIG. 3B explained in the first embodiment.

As a method for calculating the TI period or the set of TI periods to be used in the third pulse sequence and the fourth pulse sequence, for example, the processing circuitry 150 may receive an input from the user via the input device 134 by employing the controlling function 133. As another method, by employing the controlling function 133, the processing circuitry 150 may calculate an index such as a peak signal value, a peak flow time, arterial transit time, a blood flow volume, or the like of the imaged region based on the first pulse sequence and the second pulse sequence, as explained in the first embodiment, so as to further calculate the TI period or the set of TI periods to be used in the third pulse sequence and the fourth pulse sequence based on the calculated index.

Subsequently, at step S220, the sequence controlling circuitry 120 executes the third pulse sequence being a Tag-ON sequence and the fourth pulse sequence being a Tag-OFF sequence, while applying the spatially non-selective IR pulse, with respect to the TI period or the set of TI periods calculated at step S210. In an example, the sequence controlling circuitry 120 executes: the third pulse sequence in which the spatially selective IR pulse and the spatially non-selective pulse are applied, and subsequently, a Cartesian acquisition is performed when the TI period (or the set of TI periods) calculated at step S210 has elapsed, and a radial acquisition is performed after the Cartesian acquisition; and the fourth pulse sequence in which the spatially non-selective IR pulse is applied without applying the spatially selective IR pulse, and subsequently, a Cartesian acquisition is performed when the TI period (or the set of TI periods) has elapsed, and a radial acquisition is performed after the Cartesian acquisition.

After that, at step S230, by employing the generating function 136, the processing circuitry 150 generates a magnetic resonance imaging image of the imaged region based on data obtained from the third pulse sequence and the fourth pulse sequence.

The process at step S220 and the process at step S230 are the same as the processes in the first embodiment. Accordingly, duplicate explanations thereof will be omitted.

Similarly to the first embodiment, by applying the spatially non-selective pulse at step S220, the magnetic resonance imaging apparatus 100 according to the embodiment is able to suppress the MT effect. It is therefore possible to use, as the imaged region, a region other than the heart such as a region in the brain, a muscle, or a kidney, a region including microvascularization, a region including microcirculation, or the like. Further, similarly to the first embodiment, by employing the generating function 136, the processing circuitry 150 is able to calculate the peak signal value, the peak flow time, the arterial transit time, the blood flow volume, or the like of the imaged region as the index, based on the data obtained from the third pulse sequence and the fourth pulse sequence. It is therefore possible to predict the degree of a stenosis or an occlusion of the blood vessel, an abnormality in a perforator branch, or the like based on the calculated index.

Other Embodiments

Possible embodiments are not limited to the above examples.

The magnetic resonance imaging apparatus 100 according to an embodiment may, for example, predict the degree of a stenosis or an occlusion of a blood vessel or an abnormality in a perforator branch, based on an image of the blood vessel obtained by Magnetic Resonance Angiography (MRA) implemented with a Time of Flight (TOF) method, together with the index of the imaged region explained in the first embodiment such as a peak signal value, a peak flow time, arterial transit time, a blood flow volume, or the like.

Figure 9A:
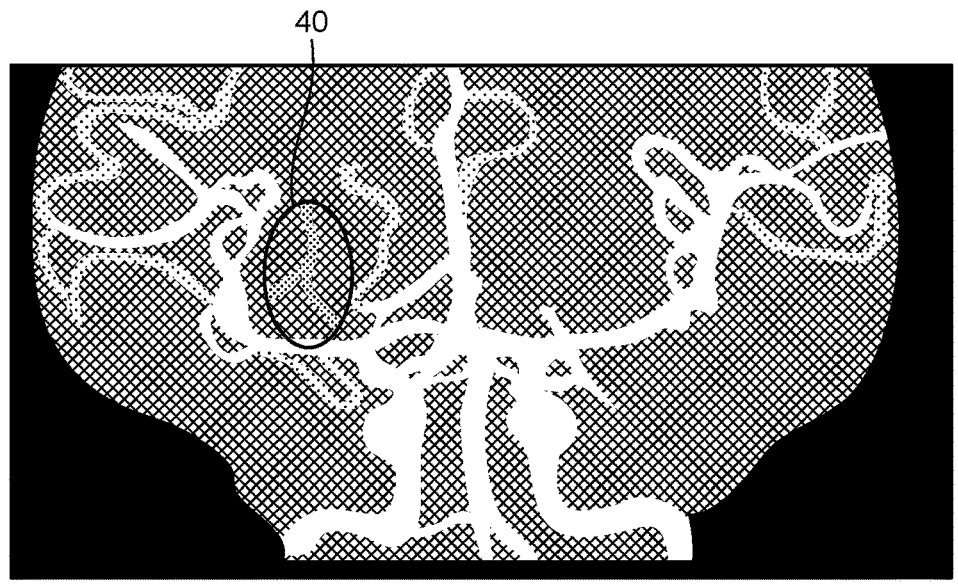
FIGS. 9A and 9B are drawings for explaining a process performed by the magnetic resonance imaging apparatus according to another embodiment.
Figure 9B:
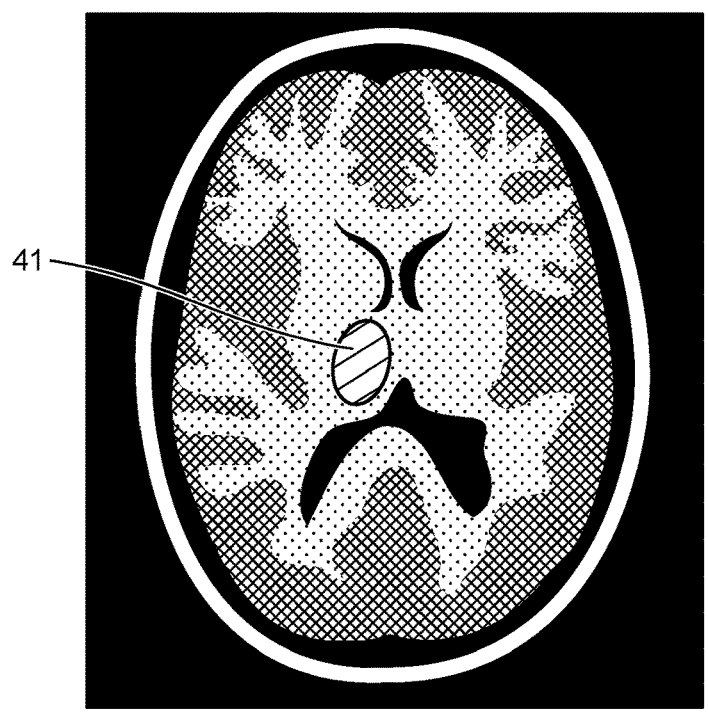

This example will be explained, with reference to FIGS. 9A and 9B. FIGS. 9A and 9B illustrate images of Magnetic Resonance Angiography (MRA) using a 3D TOF method. FIG. 9A illustrates a coronal image of the brain, whereas 9B illustrates an axial image of the brain. In FIG. 9A, although a low-signal region 40 of an MRA signal is observed, it may be difficult in some situations, for example, to judge an abnormality in a perforator branch or the like from the MRA data alone, because microvascularization naturally has a low signal. To cope with this situation, for example, it is possible to predict an abnormality in a perforator branch, when a hypoperfusion signal is obtained as the magnetic resonance signal obtained by executing the pulse sequences in the first or the second embodiment on the thalamus 41, which is a region related to the blood vessels in the low-signal region 40 of the MRA signal. In other words, the magnetic resonance imaging apparatus 100 according to the embodiment is able to predict the degree of a stenosis or an occlusion of the blood vessel or an abnormality in a perforator branch, by performing a comprehensive evaluation using the index calculated by the processing circuitry 150 while employing the generating function 136, together with the MRA image. In other words, based on a relationship between the position of the parenchyma of the brain and blood vessel information obtained from the MRA image or the like, for example, the magnetic resonance imaging apparatus 100 according to the embodiment is able to identify the position of a blood vessel that affects the normal/abnormal state of the parenchyma of the brain and is thus able to predict the status of progress of a disease or the like, for example.

Further, in the first embodiment, the 4D imaging method is not limited to performing a 3D acquisition while varying the TI value and may be a 3D Cine acquisition, for example.

Computer Programs

The instructions in the processing procedure described in the above embodiments may be executed based on a computer program (hereinafter "program") realized with software. As a result of a general-use computer storing therein the program in advance and reading the program, it is possible to achieve the same advantageous effects as those achieved by the magnetic resonance imaging apparatus 100 according to any of the above embodiments. The instructions described in the above embodiments may be recorded as a computer-executable program on a magnetic disk (e.g., a flexible disk or a hard disk), an optical disk (e.g., a Compact Disk Read-Only Memory [CD-ROM], a CD Recordable [CD-R], a CD ReWritable [CD-RW], a Digital Versatile Disk Read-Only Memory [DVD-ROM], a DVD Recordable [DVD±R], DVD ReWritable [DVD±RW]), a semiconductor memory, or a similar recording medium. Any storage format may be used as long as the storage medium is readable by a computer or an embedded system. By reading the program from the recording medium and causing a CPU to execute the instructions written in the program based on the read program, the computer is able to realize the same operations as those performed by the magnetic resonance imaging apparatus 100 according to any of the above embodiments. Further, when the computer obtains or reads the programs, the program may be obtained or read via a network.

Further, based on the instructions in the program installed in the computer or the embedded system from the storage medium, an Operating System (OS) working in the computer or Middleware such as database management software or a network may execute a part of the processes for realizing any of the above embodiments. Further, the storage medium does not necessarily have to be independent of the computer or the embedded system and may be a storage medium storing therein or temporarily storing therein the program transmitted via a Local Area Network (LAN), the Internet, or the like and downloaded. Further, the storage medium does not necessarily have to be singular. Possible embodiments of the storage medium include the situation where the processes of the above embodiments are executed from two or more media. It is possible to use any configuration for the one or more media.

The computer or the embedded system according to the above embodiments is configured to execute the processes in the above embodiments based on the program stored in the one or more storage media and may be configured as a single apparatus such as a personal computer or a microcomputer or as a system in which a plurality of apparatuses is connected together via a network. Further, the "computer" according to the embodiments does not necessarily have to be a personal computer and may be an arithmetic processing device included in an information processing device or a microcomputer. The term "computer" is a generic name for any device or apparatus capable of realizing the functions of the embodiments by using the program.

According to at least one aspect of the embodiments described above, it is possible to suppress the MT effect.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus, comprising:
sequence controlling circuitry configured to execute (i) a first pulse sequence in which a spatially selective inversion recovery (IR) pulse and a spatially non-selective IR pulse are applied, and subsequently a Cartesian acquisition is performed when a first Inversion Time (TI) period has elapsed, and a radial acquisition is performed after the Cartesian acquisition, and (ii) a second pulse sequence in which the spatially non-selective IR pulse is applied without applying the spatially selective IR pulse, and subsequently a Cartesian acquisition is performed when the first TI period has elapsed, and a radial acquisition is performed after the Cartesian acquisition, while varying the first TI period, with respect to a plurality of first TI periods; and
processing circuitry configured to calculate a second TI period to be used in a third pulse sequence and a fourth pulse sequence, based on data obtained from the first pulse sequence and the second pulse sequence executed by the sequence controlling circuitry, wherein
the sequence controlling circuitry is further configured to execute (iii) the third pulse sequence in which the spatially selective IR pulse and the spatially non-selective IR pulse are applied, and subsequently a Cartesian acquisition is performed when the second TI period has elapsed, and a radial acquisition is performed after the Cartesian acquisition, and (iv) the fourth pulse sequence in which the spatially non-selective IR pulse is applied without applying the spatially selective IR pulse, and subsequently a Cartesian acquisition is performed when the second TI period has elapsed, and a radial acquisition is performed after the Cartesian acquisition, and
the processing circuitry is further configured to generate a magnetic resonance image of an imaged region based on data obtained from the third pulse sequence and the fourth pulse sequence,
wherein the processing circuitry is further configured to calculate, as an index, with respect to the imaged region, at least one of a peak signal value, a peak flow time, an arterial transit time, and a blood flow volume, based on the data obtained from the third pulse sequence and the fourth pulse sequence,
the imaged region is a region in a brain, and
the processing circuitry is further configured to predict a degree of a stenosis or an occlusion of a blood vessel based on a Magnetic Resonance Angiography (MRA) image and the calculated index.

2. The magnetic resonance imaging apparatus according to claim 1, wherein the imaged region includes a region having one of microvascularization and microcirculation.

3. The magnetic resonance imaging apparatus according to claim 1, wherein the processing circuitry is further configured to detect the stenosis, which is equal to or smaller than 50% of a diameter of a blood vessel, based on the index.

4. The magnetic resonance imaging apparatus according to claim 1, wherein
the processing circuitry is further configured to predict an abnormality in a perforator branch, based on the index.

5. A magnetic resonance imaging method implemented by a magnetic resonance imaging apparatus, the magnetic resonance imaging method comprising:
executing, by sequence controlling circuitry, (i) a first pulse sequence in which a spatially selective Inversion recovery (IR) pulse and a spatially non-selective IR pulse are applied, and subsequently a Cartesian acquisition is performed when a first Inversion Time (TI) period has elapsed, and a radial acquisition is performed after the Cartesian acquisition, and (ii) a second pulse sequence in which the spatially non-selective IR pulse is applied without applying the spatially selective IR pulse, and subsequently a Cartesian acquisition is performed when the first TI period has elapsed, and a radial acquisition is performed after the Cartesian acquisition, while varying the first TI period, with respect to a plurality of first TI periods;
calculating, by processing circuitry, a second TI period to be used in a third pulse sequence and a fourth pulse sequence, based on data obtained from the first pulse sequence and the second pulse sequence;
executing, by the sequence controlling circuitry, (iii) the third pulse sequence in which the spatially selective IR pulse and the spatially non-selective IR pulse are applied, and subsequently a Cartesian acquisition is performed when the second TI period has elapsed, and a radial acquisition is performed after the Cartesian acquisition, and (iv) the fourth pulse sequence in which the spatially non-selective IR pulse is applied without applying the spatially selective IR pulse, and subsequently a Cartesian acquisition is performed when the second TI period has elapsed, and a radial acquisition is performed after the Cartesian acquisition; and
generating, by the processing circuitry, a magnetic resonance image of an imaged region based on data obtained from the third pulse sequence and the fourth pulse sequence,
wherein the imaged region is a region in a brain, and
the method further includes
calculating, as an index, with respect to the imaged region, at least one of a peak signal value, a peak flow time, an arterial transit time, and a blood flow volume, based on the data obtained from the third pulse sequence and the fourth pulse sequence, and
predicting a degree of a stenosis or an occlusion of a blood vessel based on a Magnetic Resonance Angiography (MRA) image and the calculated index.

* * * * *